US012628323B2

(12) United States Patent
Ben-Haim et al.

(10) Patent No.: US 12,628,323 B2
(45) Date of Patent: May 12, 2026

(54) ASSEMBLY FOR ELECTRIC FIELD GENERATION OR ELECTRIC FIELD CONVERSION VIA CAPACITIVE COUPLING

(71) Applicant: AWL-ELECTRICITY INC, Montreal (CA)

(72) Inventors: Amram Ben-Haim, Brossard (CA); Marcel Chanu, Lachine (CA); Cedric Hamel-Bruneau, Montreal (CA)

( * ) Notice: Subject to any disclaimer, the term of this patent is extended or adjusted under 35 U.S.C. 154(b) by 21 days.

(21) Appl. No.: 18/805,590

(22) Filed: Aug. 15, 2024

(65) Prior Publication Data

US 2025/0063707 A1 Feb. 20, 2025

Related U.S. Application Data

(60) Provisional application No. 63/639,077, filed on Apr. 26, 2024, provisional application No. 63/519,866, filed on Aug. 16, 2023.

(51) Int. Cl.
| | |
|---|---|
| *H05K 9/00* | (2006.01) |
| *H02J 50/05* | (2016.01) |
| *H02J 50/70* | (2016.01) |

(52) U.S. Cl.
CPC ............ *H05K 9/0084* (2013.01); *H02J 50/05* (2016.02); *H02J 50/70* (2016.02)

(58) Field of Classification Search
CPC ..................................................... H05K 9/0084
See application file for complete search history.

(56) References Cited

U.S. PATENT DOCUMENTS

| | | | | |
|---|---|---|---|---|
| 5,698,818 A | * | 12/1997 | Brench | ................... G06F 1/182 174/385 |
| 6,252,161 B1 | * | 6/2001 | Hailey | ................. H05K 9/0041 174/383 |
| 2024/0098954 A1 | * | 3/2024 | Toyoda | ................. H05K 9/0094 |

* cited by examiner

*Primary Examiner* — Hung V Ngo

(57) ABSTRACT

An assembly for electrical field power generation or for electrical field power conversion is provided. The assembly comprises an electrically conductive plate, a dielectric layer and a shield plate. The electrically conductive plate defines at least one area of conductive material. The dielectric layer defines a first side and a second side. The at least one conductive material is in electric contact with the first side of the dielectric layer. The shield plate electrically insulates the second side of the dielectric layer.

12 Claims, 5 Drawing Sheets

100

100

120

100

140

142

144

ASSEMBLY FOR ELECTRIC FIELD GENERATION OR ELECTRIC FIELD CONVERSION VIA CAPACITIVE COUPLING

TECHNICAL FIELD

The present disclosure relates to the field of electric field generation and electric field conversion. More specifically, the present disclosure presents an assembly for electric field generation or electric field conversion via capacitive coupling.

BACKGROUND

Wireless power transfer of electrical energy is based on the capability of transferring electrical energy by generating an electric field for the electric power to be transferred) and converting the electric field potential into electricity, without establishing a conductive contact therebetween. Wireless power transfer avoids the use of an electrical connector (e.g. an electrical power outlet or a Universal Serial Bus (USB) cable).

Various techniques for implementing wireless power transfer have been known for a long time (although implementation of these techniques on an industrial and commercial scale are more recent). One of these techniques is based on electric field coupling systems, which use electrically conductive plates for implementing the wireless power transfer functionality. The wireless power transfer functionality is based on a coupling of electric fields between the conductive plates. The quality of electric field coupling systems can be improved by generating a high-frequency electric field and/or relying on highly sensitive circuits (resonant/High Q).

The performance, reliability and safety of electric field coupling systems is affected by various factors, including parasitic capacitance from the environment of the electric field power generator and/or the electric field absorbing unit, as well as the difficulty to have a reliable capacitance in the components of the electric field power generator and/or electric field conversion unit.

Therefore, there is a need for a new assembly for wireless electrical power transfer via capacitive coupling.

SUMMARY

According to a first aspect, the present disclosure provides an assembly for electrical field power generation. The assembly comprises an electrically conductive plate, the electrically conductive plate defining at least one area of conductive material. The assembly further comprises a dielectric layer. The dielectric layer defines a first side and a second side. The at least one conductive material is in electric contact with the first side of the dielectric layer. The assembly further comprises a shield plate. The shield plate electrically insulates the second side of the dielectric layer.

According to a second aspect, the present disclosure provides an assembly for electrical field potential conversion. The assembly comprises an electrically conductive plate. The electrically conductive plate includes at least one conductive material. The assembly further comprises a dielectric layer. The dielectric layer defines a first side and a second side. The at least one conductive material is in electric contact with the first side of the dielectric layer. The assembly further comprises a shield plate. The shield plate electrically insulates the second side of the dielectric layer.

In a particular aspect, the dielectric layer is made of one of: polyethylene, epoxy or glass-reinforced epoxy laminate material.

In another particular aspect, the dielectric layer defines an indentation for receiving the electrically conductive plate.

In yet another particular aspect, at least one of the electrically conductive plate, the dielectric layer and the shield plate defines a plurality of apertures.

In a particular aspect, the plurality of apertures defines a honeycomb structure.

In yet another aspect, the plurality of apertures of the honeycomb structure is one of: filled with dry air or made into a vacuum.

In another particular aspect, the dielectric layer comprises a plurality of stacked sub-layers with different electrical permittivity.

In a particular aspect, the assembly further comprises a protective plate positioned above the dielectric layer and the at least one electrically conductive plate.

In another particular aspect, the protective plate is made of another dielectric material.

BRIEF DESCRIPTION OF THE DRAWINGS

Embodiments of the disclosure will be described by way of example only with reference to the accompanying drawings, in which.

DETAILED DESCRIPTION

The foregoing and other features will become more apparent upon reading of the following non-restrictive description of illustrative embodiments thereof, given by way of example only with reference to the accompanying drawings.

Various aspects of the present disclosure generally address one or more of the problems related to the improvement of the design and functionalities of assembly for electrical field generation and assembly for electrical field conversion.

Prior art solutions are limited in their public adoption for multiple reasons, which include without being limited thereto: costs, manufacturing difficulties which increase costs, overheating while charging and inconsistent performances. Some or all of these problems are resolved independently or concurrently with the various embodiments of the present invention.

Throughout the present specification, the following expressions are used as follows:

Capacitive plate: an area of conductive material, the conductive material may be continuous or a structure of conductive material interspersed with non-conductive material. Throughout the present specification, the word plate is meant to refer to a volume and not solely to a polygon, as any 3D shape is characterized by a volume;

Conductive material: material with a high conductivity rating, i.e. low electrical resistivity. Examples of conductive materials include copper, iron, gold, aluminum, silver and alloys made thereof; and Dielectric layer: a substrate with low electrical polarizability. Examples of dielectric layers include a substrate made or polyethylene material or other compounds of similar chemical composition, epoxy or other compounds of similar chemical composition; substrates comprising vacuum areas, air gaps, and/or gaps filled with polyethylene material or epoxy or other compounds of similar chemical composition, and glass-reinforced epoxy laminate material.

Capacitive coupling between an electric field power generator and an electric field power converter allows transfer of electric energy therebetween. Although the dielectric properties of space between the electric field power generator and the electric field power converter cannot be controlled, the electric properties of the assemblies generating the electric field or converting the electrical potential must be carefully selected and the assemblies manufactured to optimize the efficient transfer of electric energy therebetween.

The present invention provides an assembly which improves the efficient generation of electric field (when implemented in an electric field power generator) or the conversion of electric field potential (when implemented in an electric field power converter).

Figure 1:
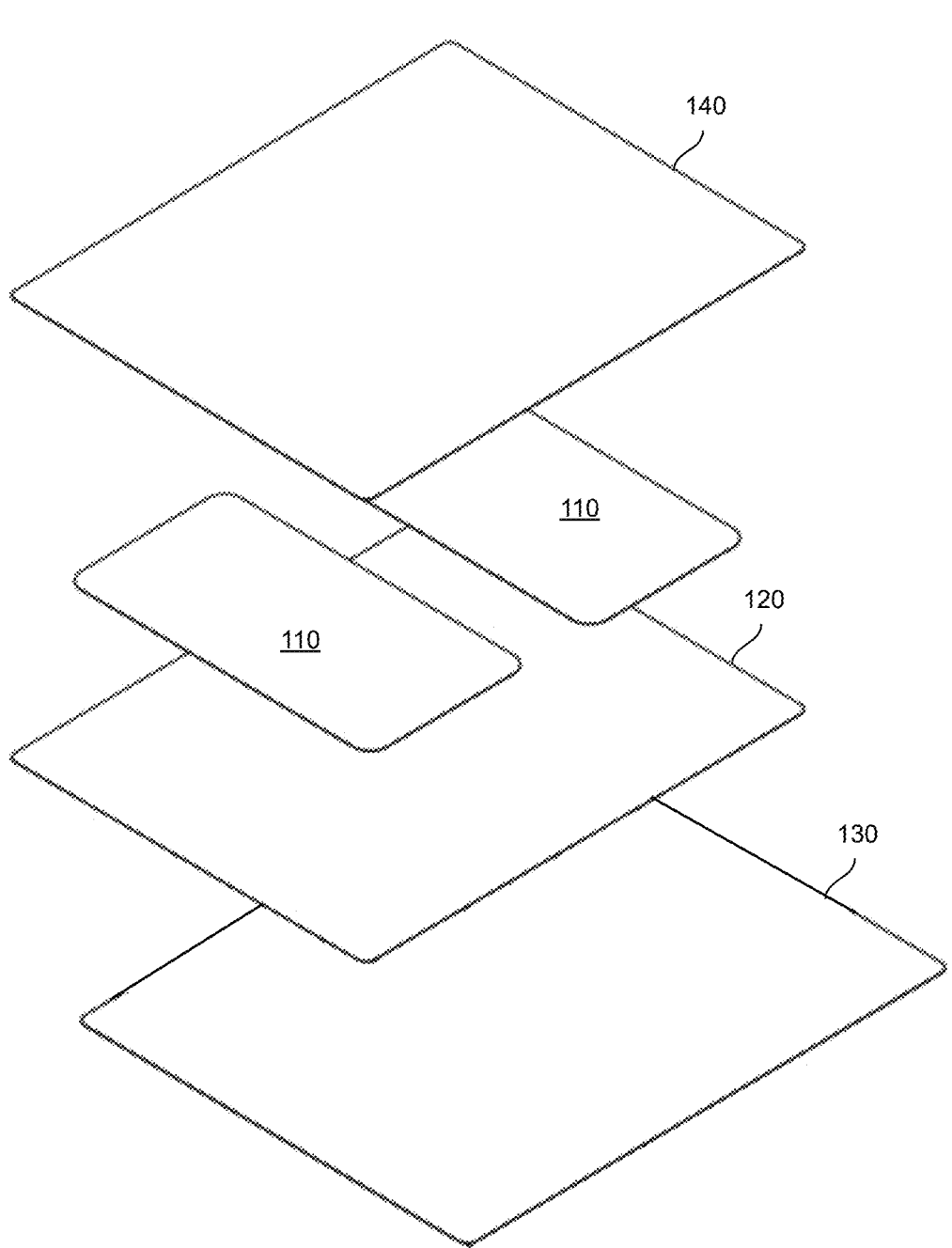
FIG. 1 is a perspective exploded view is of components of an assembly.
Figure 2:
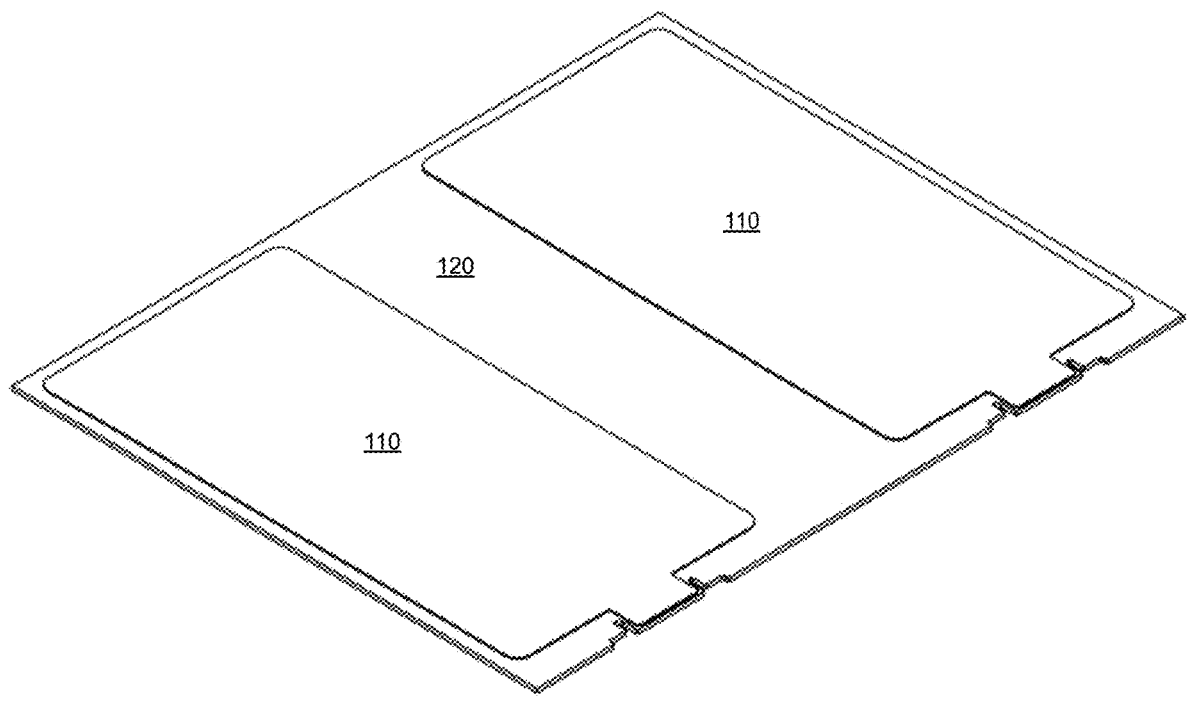
FIG. 2 is a perspective view of a subset of the components of the assembly of FIG. 1.
Figure 3:
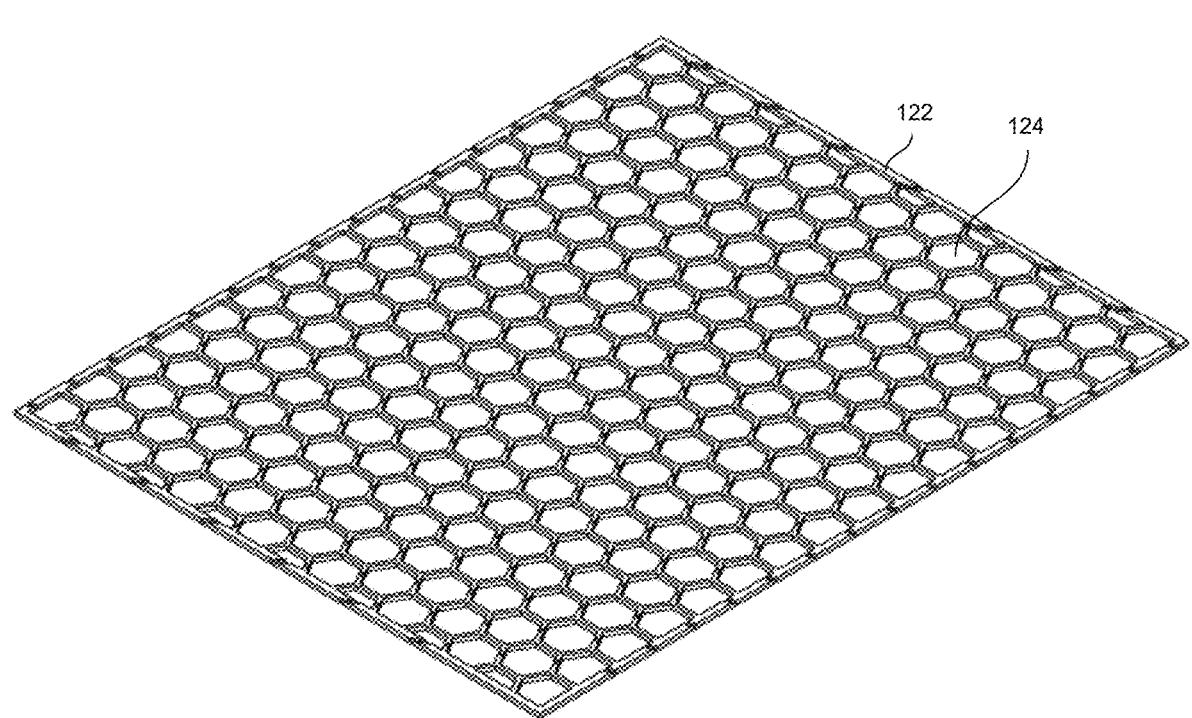
FIG. 3 is a perspective view of an alternative dielectric material.

Reference is now made concurrently to FIGS. 1, 2 and 3. FIG. 1 is a perspective view of components of an assembly 100. The assembly 100 is adapted for generating an electrical field when used in an electric field power generator. Alternatively, the assembly 100 is adapted for converting the electrical field potential when used in an electric field power converter. The assembly 100 comprises at least one electrically conductive plate 110, i.e. two shown on FIGS. 1 and 2. The electrically conductive plate 110 is at least partially in contact with a dielectric layer 120. FIG. 2 is a perspective view of two electrically conductive plates 110 in contact with the dielectric layer 120. FIG. 3 is a perspective view of a dielectric layer 120 alternative. The assembly 100 further comprises a shield plate 130. Optionally, the assembly 100 could further comprise a protective plate 140 only represented in FIG. 1.

Referring now to FIGS. 1 and 2, two electrically conductive plates 110 are represented. The electrically conductive plates are composed of areas of conductive material. The electrically conductive plates 110 are not limited to such an implementation and variants in configuration and material could be used. Thus each electrically conductive plate 110 may comprise any number of areas of conductive material. For implementations requiring resonant capabilities or high-frequency electric field, those skilled in the art will understand that the number of electrically conductive plates 110 would need to be in even number to allow resonance therebetween.

FIGS. 1 and 2 represent the electrically conductive plates 110 having substantially a rectangular shape for illustration purposes only. The electrically conductive plates 110 may have one of the following shapes: circular, elliptic, square, rectangle, etc. Furthermore, the electrically conductive plates 110 of a given assembly 100 may have the same or different shapes, the same or different sizes (length, width, thickness), may be made of the same material, be made of different materials, etc.

FIGS. 1 and 2 represent the electrically conductive plates 110 being parallel to each other for illustration purposes only. The positioning and orientation of the electrically conductive plates 110 on the dielectric layer 120 may vary.

In an exemplary configuration, a plurality of electrically conductive plates 110 may be positioned to form a matrix of conductive plates 110 on the dielectric layer 120. In another exemplary configuration, a plurality of electrically conductive plates 110 may be positioned concentrically on the dielectric layer 120.

The electrically conductive plates 110 are positioned on a first surface of the dielectric layer 120. Alternatively, the electrically conductive plates 110 may be partly embedded in the dielectric layer 120. In yet another embodiment, the electrically conductive plates may be embedded in the dielectric layer 120, where a surface of the electrically conductive plates 110 are flush with the first side of the dielectric layer 120.

In an exemplary implementation, the dielectric layer 120 is made of a glass-reinforced epoxy laminate material. For example, the dielectric layer 120 is made of FR-4, FR-4 being a type of glass-reinforced epoxy laminate material as is well known in the art. Alternatively, the dielectric layer 120 may be composed of an epoxy compound.

Thus the electrically conductive plate 110 is made of at least one area of conductive material deposited on the dielectric layer 120. For example, the area(s) of conductive material may be made of copper. Alternatively, the area(s) of conductive material may be made of an alloy comprising copper or any metal alloy or material with sufficiently high electrical conductivity for the context of the present assembly.

Optionally, the dielectric layer 120 could comprise a plurality of sub-layers (not represented in the Figures for simplification purposes). The sub-layers could be stacked upon one another to constitute the dielectric layer 120. Each sub-layer could have different characteristics (e.g. constitutive material, permittivity, etc.). In this case, a permittivity of the dielectric layer 120 would be defined and calculated by taking into consideration permittivity of each of its sub-layers to calculate a resulting electrical permittivity.

Referring now to FIGS. 1 and 3, where FIG. 3 shows an alternative for the dielectric layer 120, where the dielectric layer 120 is a structure 122 defining apertures (also referred to as gaps) 124. The structure 122 is made of a material having a low permittivity. A person skilled in the art will readily understand that a material having a low permittivity may also be referred to as a material having a low dielectric constant (the dielectric constant of a material is the ratio of the permittivity of the material to the permittivity of a vacuum).

In an exemplary implementation, the structure 122 is made of polyethylene. In another exemplary implementation, the structure 122 is made of a glass-reinforced epoxy laminate material (e.g. FR-4).

The structure 122 is designed to be sufficiently robust while maximizing the number and/or the volume of the apertures 124. For example, the structure 122 is designed as a honeycomb structure, as illustrated in FIG. 3. A person skilled in the art would readily understand that the design of the structure 122 is not limited to the honeycomb structure illustrated in FIG. 3, and that other designs for the structure 122 are supported by the present disclosure.

Alternatively, instead of or in addition to the apertures 124, the structure 122 includes indentations (not represented in the Figures). As is well known in the art, each aperture 124 extends from an upper surface of the structure 122 to a lower surface of the structure 122. By contrast, an indentation extends from one of the upper or lower surfaces of the structure 122 but does not extend up to the opposite surface.

Throughout the description, the structure 122 will be described as having the apertures 124 illustrated in FIG. 3. However, a person skilled in the art will readily adapt the features and functionalities of the apertures 124 to indentations, as well as to apertures and indentations having different shapes and numbers, and to the structure 122 having any size or shape.

The structure 122 provides multiple advantages: it participates to the overall electrical permittivity of the assembly 100, it can participate to the rigidity or flexibility of the assembly 100, and it acts as an intermediate structure between the dielectric layer 120 and the shield plate 130. Furthermore, because of the particularities of the structure 122 provided with apertures 124, and the possibility of using different materials in the apertures 124 so as to vary the electrical permittivity over the dielectric layer 120. The structure 122, and more particularly the apertures 124 allow introduction of air and/or air vacuum cells into the assembly 100. Air and vacuum are the best options for low electrical permittivity, and can greatly improve the performances of the assembly 100. Although shown as apertures 124, those skilled in the art will understand that the dielectric layer 120 could be composed of a substrate with air bubbles inserted therein. Furthermore, the dielectric layer 120 is selected and formed to adapt to the thickness requirements of the assembly 100.

In an exemplary implementation, the apertures 124 (or indentations) are filled with dry air. In another exemplary implementation, vacuum is made in the apertures 2 (or indentations). Apertures 124 where vacuum has been made will be referred to as vacuum apertures. A perfect vacuum has the lowest possible permittivity (usually referred to as $\varepsilon_0$). Vacuum apertures 124 (or vacuum indentations) do not implement a perfect vacuum but provide a very low permittivity. The air also has a low permittivity, the dryer the air the lower the permittivity. Thus, dry air apertures 124 (or dry air indentations) also have a very low permittivity, although not as low as vacuum apertures 124 (or vacuum indentations).

The advantage of using vacuum apertures 124 (or vacuum indentations) and dry air apertures 124 (or dry air indentations) is that the global permittivity of the assembly 100 is lowered in comparison to any low electrical permittivity layer 120 without apertures (or indentations) 124. The previously mentioned honeycomb structure is an exemplary design of the structure 122 implementing the apertures 124 while complying with a pre-defined thickness of the structure 122.

Using vacuum apertures 124 (or vacuum indentations) is particularly advantageous. Vacuum being the weakest dielectric, if anything other than vacuum is used to fill the apertures 124 (or indentations), a thicker low electrical permittivity layer 120 is needed to achieve a global permittivity of the assembly 100. Thus, using vacuum apertures 124 (or vacuum indentations) provides the thinnest form factor possible for the assembly 100. In industries that require miniaturization to integrate into small products, having the thinnest assembly 100 is a substantial advantage in terms of product design without compromising performance.

More generally, the global permittivity of the assembly 100 is lowered by modifying thickness, materials and composition of the dielectric layer 120.

In another exemplary implementation, the dielectric layer 120 (more specifically the structure 122) is made of a first material and the apertures 124 (or indentations) are filled with a second material with different electrical or mechanical properties from the first material. For example, the first material has specific mechanical properties (e.g., strength, stiffness, etc.), while the second material has different mechanical properties and a lower permittivity. The apertures 124 (or indentations) are filled with the second material during manufacturing of the dielectric layer 120, prior to assembly with the electrically conductive plates 110 and the shield plate 130.

The dielectric layer 120 is positioned between the electrically conductive plates 110 and the shield plate 130. A lower surface of the dielectric layer 120 is secured to an upper surface of the shield plate 130. Any type of securing means known in the industry may be used for securing the dielectric layer 120 to the shield plate 130. Examples of securing means include bonding (e.g. using an adhesive material), welding, encapsulation, encasing, suction, or any other securing mechanism or method known in the industry.

In an exemplary implementation, the combination of the electrically conductive plate 110 and the dielectric layer 120 is designed and produced as an electronic circuit, for example a printed circuit board (PCB). A very thin layer of conductive material 112 (e.g. only traces of conductive material) is deposited on the dielectric layer 120 or within a grooved area of the dielectric layer 120 to form the electrically conductive plate 110.

As mentioned previously, a thickness of the dielectric layer 120 can be adapted to produce an assembly 100 having a specified thickness. Furthermore, maintaining a constant distance (by including the dielectric layer 120) between the electrically conductive plates 110 and the shield plate 130 provides a desired global permittivity while respecting a desired overall thickness. Therefore, having the dielectric layer 120 with the same thickness on all its surface but varying permittivity allows to implement a desired permittivity for particular positions on the assembly 100.

FIG. 1 illustrates the dielectric layer 120 and the shield plate 130 defining substantially the same surface area. However, the present disclosure is not limited to a configuration where the dielectric layer 120 and the shield plate 130 define substantially the same surface area.

In an exemplary implementation, the shield plate 130 is made of aluminum. Alternatively, the shield plate 130 may be made of an alloy comprising aluminum.

Although not represented in FIGS. 1 and 2 for simplification purposes, each electrically conductive plate 110 is adapted for receiving an electrical connection (e.g. an electrical cable) to electrically connect the electrically conductive plates 110 to an electronic circuit (not represented in the Figures). If the assembly 100 is integrated to an electrical field power generator, the electronic circuit comprises electrical and electronic components adapted for controlling the assembly for generating the electric field. If the assembly 100 is integrated to an electric field power converter, the electric field power converter further comprises electrical and electronic components adapted for controlling the assembly for converting some of the electric field potential generated by an electric field power generator into electric power.

In a particular configuration, the electric field generated or converted by the assembly is a resonant capacitive electric field.

The present design of the assembly 100 provides at least the following advantages: the manufacturing of the assembly 100 is performed with a high level of consistency and accuracy, the manufacturing and resulting assembly may be implemented at a lower cost with higher precision, improved performance in a smaller form factor. Furthermore, the assembly 100 is less subject to mechanical deformation and less susceptible to environmental conditions such as humidity and temperature.

In addition to the previously discussed components, the present assembly 100 may further be provided with a protective plate 140. The protective plate 140 is positioned over the electrically conductive plate 110 or the electrically conductive plates 110. The protective plate 140 avoids electric contact (e.g. of an object, of a human being, etc.) with the electrically conductive plate(s) 110. In an exemplary implementation the protective plate 140 is made of a dielectric material (e.g. epoxy).

The shield plate 130 has a similar role of protection, in particular against electric shock. For example, the shield plate 130 has a voltage of substantially 0 Volts (V), while the electrically conductive plate 110 has two areas of conductive material 112 at respective voltages of +500 V and −500 V. The shield plate 130 cancels the electric field generated (when the assembly is in an electric field power generator) or converted (when the assembly is in the electric field power converter) by the electrically conductive plate 110 on the lower surface of the shield plate 130 and underneath.

Figure 4:
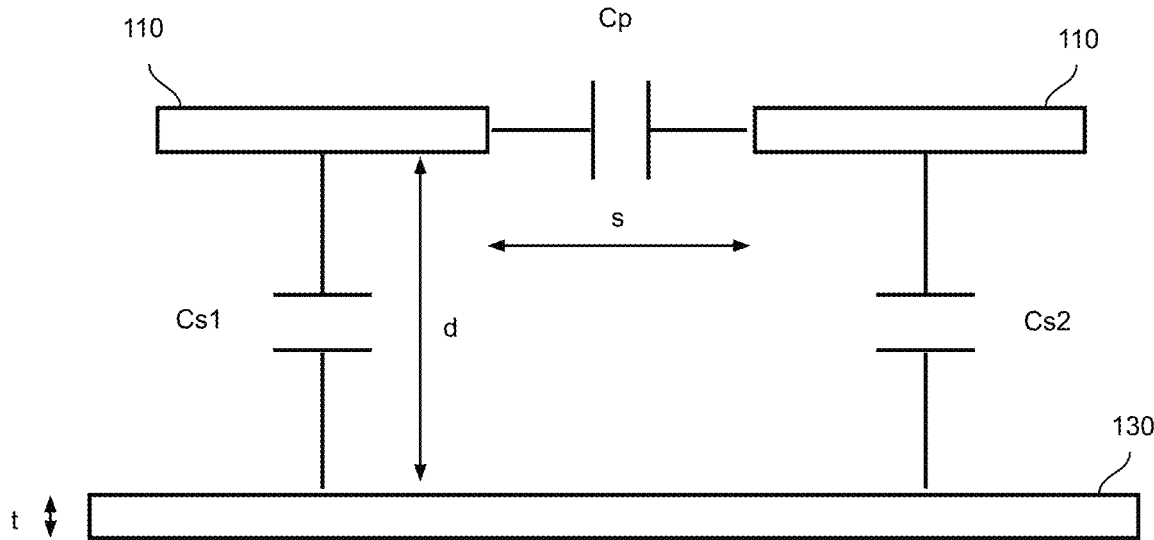
FIG. 4 is a modeling of an overall capacitance of the present assembly.

Reference is now made concurrently to FIG. 4 which illustrates a modeling of a global capacitance C for the assembly 100 of FIG. 1. The components of the assembly 100 contribute to the global capacitance C of the electrically conductive plates 110 and the shield plate 140. The dielectric layer 120 is not considered in the representation of the global capacitance of FIG. 4 as it is characterized as having low permittivity. The global capacitance C of the assembly 100 is a combination of a coplanar capacitance $C_p$ between the electrically conductive plates 110, in parallel with a combination of two capacitances $C_{s1}$ and $C_{s2}$. The capacitances $C_{s1}$ and $C_{s2}$ are defined between the conductive plates 110 and the shield plate 130.

The electrically conductive plates 110 being identical and the shield plate 10 extending continuously below the two electrically conductive plates 110, $C_{s1}$ and $C3_{s2}$ have the same value, which will be referred to as $C_s$.

The following equation (1) provides the calculation of the global capacitance C for the assembly 100:

$$C = C_p + \frac{C_s}{2}$$

In the following, for illustration purposes, the two electrically conductive plates 110 are considered to have a rectangular shape. The following equation for the calculation of $C_p$ may need to be adapted in the case where the electrically conductive plates 110 do not have a rectangular shape.

The calculation of $C_p$ is well known in the art. The value of $C_p$ is calculated based on the length l and the width w of the electrically conductive plates 110, the distance s between the electrically conductive plates 110, the relative dielectric constant $\varepsilon_r$ of the dielectric layer 120 and the speed of the light in a vacuum $v_0$.

The distance s is represented in FIG. 4. The length l and the width w of the electrically conductive plates 110 are considered self-explanatory.

The following equation (2) provides the calculation of the capacitance $C_p$:

$$C_p = \frac{1}{377\pi v_0}\varepsilon_r l \ln\left(-\frac{2}{\sqrt{1-\frac{s^2}{(s+2w)^2}}-1}\left(2\sqrt{1-\frac{s^2}{(s+2w)^2}}+1\right)\right),$$

$$\text{for } 0 < \frac{s}{s+2w} \le \frac{1}{\sqrt{2}}$$

$$C_p = \frac{\varepsilon_r l}{120 v_0 \ln\ln\left(-\frac{2}{\left(\sqrt{\frac{s}{s+2w}}-1\right)}\left(\sqrt{\frac{s}{s+2w}}+1\right)\right)}, \text{ for } \frac{1}{\sqrt{2}} < \frac{s}{s+2w} \le 1$$

For example, for electrical conductive plates 110 having a length l of 190 millimeters and a width w of 90 millimeters, separated by a distance s of 65 millimeters, with a dielectric layer 120 consisting of FR-4 with a relative dielectric constant $\varepsilon_r$ of 4.05, the speed of the light in a vacuum $v_0$ being $3 \cdot 10^8$ meters per second, the value of $C_p$ is 12.98 picofarads (pF).

The calculation of $C_s$ is also well known in the art. The value of $C_s$ is calculated based on the area A1 each electrically conductive plate 110, the area $A_2$ of the shield plate 140, the distance d (represented in FIG. 5) between each electrically conductive plate 110 and the shield plate 140, the relative dielectric constant $\varepsilon_r$ of the dielectric layer 120, and the permittivity $\varepsilon_0$ of the air.

The following equation (3) provides the calculation for the capacitance $C_s$:

$$C_s = \frac{2\varepsilon_0\varepsilon_r A_1 A_2}{d(A_1 + A_2)}$$

For example, for electrically conductive plates 110 having an area $A_1$ of 0.0181 square meters (m$^2$), the shield plate 130 having an area $A_2$ of 0.0632 m$^2$, the electrically conductive plates 110 and the shield plate 130 being separated by a distance d of 1.48956 millimeters, located in a dielectric layer 120 consisting of FR-4 with a relative dielectric constant $\varepsilon_r$ of 4.05, the permittivity so of the air being $8.854 \cdot 10^{-12}$, the value of $C_s$ is 648.07 pF. The area $A_1$ (e.g. 0.181 m$^2$) corresponds to the product of the previously mentioned length l (e.g. 190 millimeters) and width w (e.g. 90 millimeters).

Knowing the capacitance $C_p$ and the capacitance $C_s$, the global capacitance C of the assembly 100 is calculated as follows: C=12.98+648.07/2=337.2 pF.

The value of 337.2 pF is considered to be too high for operating the assembly 100 according to pre-defined operational requirements. However, a target value for the global capacitance C was set to 72.4 pF. Thus the calculated global capacitance value C is way too high compared to the target global capacitance value.

Having a target global capacitance C and using equations (2) and (3), the following parameters can be adjusted to reach the target global capacitance C: the distance s between the two electrically conductive plates 110, the area A1 of each electrically conductive plate 110, the area $A_2$ of the shield plate 130, and the distance d between each electrically conductive plate 110 and the shield plate 130.

For example, if the global capacitance C and the capacitance $C_p$ have a predefined value (e.g. 337.2 and 12.98 respectively), the distance d has a predefined value (e.g. $1.48956 \cdot 10^{-3}$), the area $A_2$ has a predefined value (e.g.

0.0632) and the value of $\varepsilon_r$ is known (e.g. 4.05), the value of $A_1$ can be calculated accordingly based on equations (1) and (3).

The following equation (4) provides the calculation of $A_1$:

$$A_1 = \frac{-dA_2(C - C_p)}{d(C - C_p) - \varepsilon_0\varepsilon_r A_2}$$

With the previously mentioned values for equation (4), the value of the area of the electrically conductive plates 110 $A_1$ is 0.00197 $m^2$. This is significantly lower than the previously mentioned value of $A_1$: 0.0171 $m^2$.

One way to reduce the area $A_1$ of the electrically conductive plates 110 is to design electrically conductive plates 110 with apertures, the apertures reducing the overall area of the electrically conductive plates 110. For example, each electrically conductive plate 110 is a rectangular plate comprising a plurality of rectangular apertures therein, forming a rectangular mesh structure, such as shown on FIG. 5.

In the context of the assembly 100 being used to generate an electric field or to convert electrical field potential energy from the electric field, also referred to as capacitive coupling, reducing the area $A_1$ of the electrically conductive plates 110 reduces the capacitance between an electric field power generator in which the present assembly is incorporated and an electric field power converter in which the present assembly 100 is implemented, thereby customizing the amount of electrical power which can be transferred therebetween via capacitive coupling.

For example, if the global capacitance C and the capacitance $C_p$ have a predefined value (e.g. 337.2 and 12.98 respectively), the distance d has a predefined value (e.g. $1.48956 \cdot 10^{-3}$), the area $A_1$ has a predefined value (e.g. 0.0171) and the value of $\varepsilon_r$ is known (e.g. 4.05), the value of $A_2$ can be calculated accordingly based on equations (1) and (3).

The following equation (5) provides the calculation of $A_2$:

$$A_2 = \frac{-dA_1(C - C_p)}{d(C - C_p) - \varepsilon_0\varepsilon_r A_1}$$

With the previously mentioned values for equation (5), the value of the area (of the shield plate 140) $A_2$ is 0.00197 $m^2$. This is significantly lower than the previously mentioned value of $A_2$: 0.0632 $m^2$.

As mentioned previously with respect to the electrically conductive plates 110, one way to reduce the area $A_2$ of the shield plate 130 is to design a shield plate 130 with apertures, the apertures reducing the overall area of the shield plate 130. For example, the shield plate 130 is a rectangular plate comprising a plurality of rectangular apertures therein, forming a rectangular mesh structure 140, as shown on FIG. 5.

Figure 5:
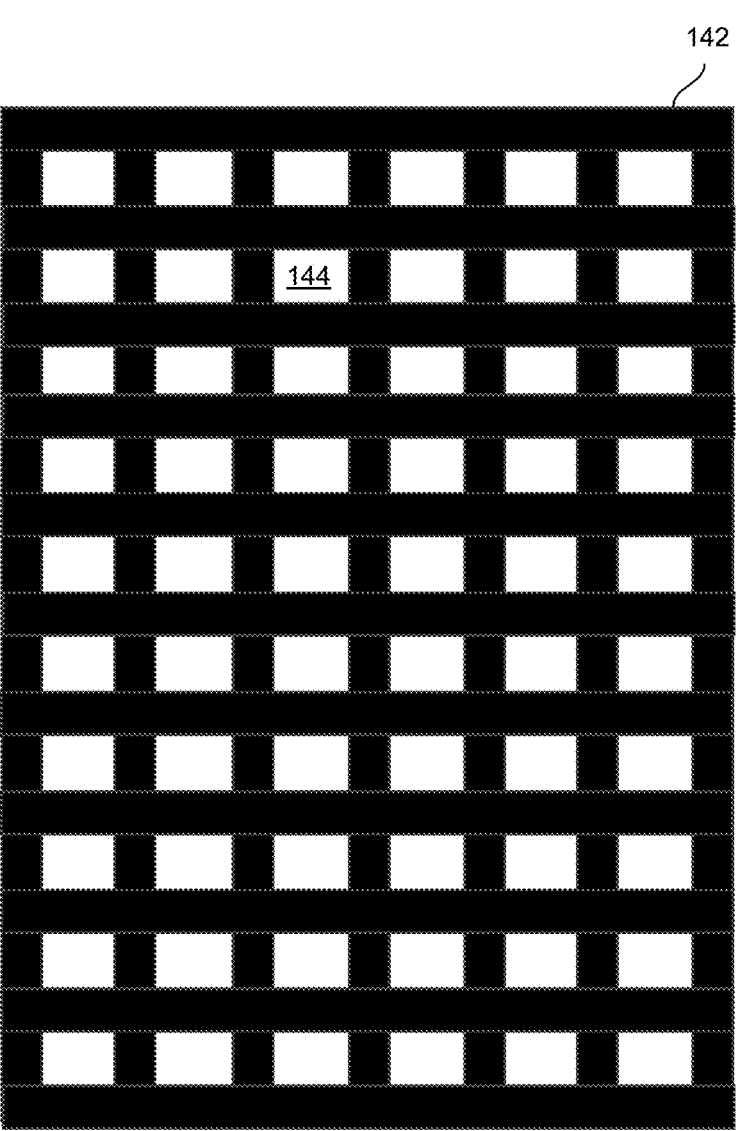
FIG. 5 is of a top view of an exemplary mesh structure.

FIG. 5 represents a top or bottom view of the mesh structure 140 is made of a mesh structure 142 with apertures 144. The area $A_2$ of the mesh structure 140 is a nominal area of the structure 142 if it had no apertures minus the sum of the areas of the apertures 144.

For example, the nominal area is 0.0632 $m^2$ as mentioned previously. The structure 142 has (for illustration purposes only) 60 apertures 144, each aperture 144 having an area of 0.0010205 $m^2$. Thus, the area of the shield plate 140 is $0.0632 - 60*0.0010205 = 0.00197$ $m^2$ (the previously calculated value of $A_2$).

In an exemplary implementation, the combination of the two electrically conductive plates 110, the dielectric layer 120 and the shield plate 130 is designed and produced as an electronic circuit, for example a printed circuit board (PCB). Furthermore, the shield plate 130 may be made of copper or an alloy comprising copper.

The shield plate 130 acts as a Faraday cage, implementing the protective functionality of the shield plate 130 to cancel the electric field created by the electrically conductive plates 110 on the lower surface of the shield plate 130 and below. However, the following two criteria need to be taken into consideration to ensure that the mesh structure 142 for the shield plate 130 effectively implements the protective functionality of a Faraday cage.

One of the two criteria consists in the thickness of the material implementing the mesh structure 142 being greater than the penetration depth of the electric field generated by the assembly 100 at the operating frequency of the assembly 100. In the present implementation, the thickness of the material of the shield plate 130 is the thickness t (represented in FIG. 4) of the shield plate 130 implemented as the mesh structure 142.

The penetration depth of the electric field generated by the assembly 100 is generally referred to as the skin depth $\delta$. The calculation of $\delta$ is well known in the art. The value of $\delta$ is calculated based on the resistivity $\rho$ of the mesh structure 142, the frequency of operation f of the assembly 100, the relative permittivity $\mu_r$ of the mesh structure 142, and the permittivity of free space $\mu_o$.

The following equation (6) provides the calculation of the skin depth:

$$\delta = \sqrt{\frac{\rho}{\pi f \mu_0 \mu_r}}$$

In an exemplary implementation where the shield plate 130 implemented as the mesh structure 142 is made of copper, the resistivity $\rho$ is 1.678 micro-Ohms, the relative permittivity $\mu_r$ is 0.999991, the permittivity of free space $\mu_o$ being $4\pi \cdot 10^{-7}$. The frequency of operation f of the assembly 100 is set to 6.78 Mhz.

The corresponding value of the skin depth $\delta$ calculated with equation (6) is 25 micrometers. Thus, for this exemplary implementation, the thickness t of the shield plate 130 implemented as the mesh structure 142 needs to be greater than 25 micrometers.

The value of the thickness t may be defined based on the skin depth $\delta$, introducing a margin factor. For example, the value of the thickness t is a percentage of the skin depth $\delta$ greater than 100% (e.g. 150%, 200%, etc.).

The other one of the two criteria consists in the largest dimension of the apertures 144 in the mesh structure 142 being lower than the wavelength $\lambda$ of the electrical field in the dielectric layer 120.

The calculation of A is well known in the art. The value of $\lambda$ is calculated based on the speed of the light in a vacuum $v_0$, the relative permittivity $\mu_r$ of the second low electrical permittivity layer 120, the relative dielectric constant $\varepsilon_r$ of the second low electrical permittivity layer 120, and the frequency of operation f of the assembly 100.

The following equation (7) provides the calculation of the wavelength:

$$\lambda = \frac{v_0}{f\sqrt{\mu_r \varepsilon_r}}$$

In an exemplary implementation where the dielectric layer 120 is made of FR-4, the relative permittivity $\mu_r$ is 0.999991, the relative dielectric constant $\varepsilon_r$ is 4.05, the speed of the light in a vacuum $v_0$ being $3\cdot10^8$ meters per second. The frequency of operation f of the assembly 100 is set to 6.78 Mhz.

The corresponding value of the wavelength $\lambda$ calculated with equation (7) is approximately 22 meters. Thus, for this exemplary implementation, the largest dimension of the apertures 144 in the mesh structure 142 needs to be lower than approximately 22 meters. This second criteria is therefore automatically validated.

Based on experimental measurements, it has been determined that equation (5) does not properly model the relationship between the area $A_2$ and the capacitance $C_p$. More specifically, given a target value of the capacitance $C_p$, a value of the area $A_2$ was calculated. In this example, a prototype of the assembly 100 was made with a shield plate 130 having a calculated area $A_2$. The capacitance $C_p$, of the assembly 100 was then measured, showing a significant difference between the measured capacitance $C_p$ and the target value of the capacitance $C_p$.

The difference was due to multiple factors. One factor was that using the relative dielectric constant $\varepsilon_r$ of the dielectric layer 120 consisting of FR-4 is too simplistic. A corrective factor k had to be introduced to compensate for this simplification. Another factor was that the mesh structure 140 of the shield plate 130 modified the contribution of the capacitance $C_p$. Thus, the contribution of the capacitance $C_p$ had to be reduced in half.

The following equation (8) provides the calculation of $A_2$, introducing the corrective factor k and the contribution of $C_p$ reduced in half:

$$A_2 = \frac{-dA_1\left(C - \frac{C_p}{2}\right)}{k\left(d\left(C - \frac{C_p}{2}\right) - \varepsilon_0\varepsilon_r A_1\right)}$$

The value of the corrective factor k has been determined experimentally as 1.7535. This value is adapted to the previously described characteristics of the assembly 100 (e.g. frequency of operation f, the dielectric layer 120 being made of FR-4, etc.). The value of the corrective factor k may need to be adapted if the characteristics of the assembly 100 are different.

Although the assembly 100 illustrated in FIGS. 1-3 and the assembly 100 illustrated in FIGS. 4 and 6 have been described independently from one another, the shield plate 130 with mesh structure 142 could also be integrated to the assembly 100 illustrated in FIG. 1.

Those skilled in the art will understand that in addition to the foregoing, the quality of the electric field coupling may be improved in various ways: increasing voltage, reducing resistance between resonating electrically conductive plate 110 (better Q factor coils, . . . ), etc.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. An assembly for electrical field generation, the assembly comprising:

an electrically conductive plate, the electrically conductive plate defining at least one area of conductive material;

a dielectric layer, the dielectric layer defining a first side and a second side, the at least one area of conductive material being in electric contact with the first side of the dielectric layer wherein the dielectric layer comprises a plurality of stacked sub-layers with different electrical permittivity and defines a plurality of apertures defining a honeycomb structure; and a shield plate, the shield plate electrically insulating the second side of the dielectric layer.

2. The assembly of claim 1, wherein the dielectric layer is made of one of: polyethylene, epoxy or glass-reinforced epoxy laminate material.

3. The assembly of claim 1, wherein the dielectric layer defines an indentation for receiving the electrically conductive plate.

4. The assembly of claim 1, wherein the plurality of apertures of the honeycomb structure is one of: filled with dry air or made into a vacuum.

5. The assembly of claim 1, further comprising a protective plate positioned above the dielectric layer and the electrically conductive plate.

6. The assembly of claim 5, wherein the protective plate is made of another dielectric material.

7. An assembly for electrical field conversion, the assembly comprising:

an electrically conductive plate, the electrically conductive plate including at least one conductive material;

a dielectric layer, the dielectric layer defining a first side and a second side, the at least one conductive material being in electric contact with the first side of the dielectric layer, wherein the dielectric layer comprises a plurality of stacked sub-layers with different electrical permittivity and defines a plurality of apertures defining a honeycomb structure; and a shield plate, the shield plate electrically insulating the second side of the dielectric layer.

8. The assembly of claim 7, wherein the dielectric layer is made of one of: polyethylene, epoxy or glass-reinforced epoxy laminate material.

9. The assembly of claim 7, wherein the dielectric layer defines an indentation for receiving the electrically conductive plate.

10. The assembly of claim 7, wherein the plurality of apertures of the honeycomb structure is one of: filled with dry air or made into a vacuum.

11. The assembly of claim 7, further comprising a protective plate positioned above the dielectric layer and the at least one electrically conductive plate.

12. The assembly of claim 11, wherein the protective plate is made of another dielectric material.

\* \* \* \* \*